United States Patent [19]

Zibis et al.

[11] Patent Number: 4,672,339
[45] Date of Patent: Jun. 9, 1987

[54] ELECTRIC FILTER EMPLOYING ACOUSTIC WAVES

[75] Inventors: Peter Zibis; Gerd Riha, both of Munich; Richard Veith, Unterhaching, all of Fed. Rep. of Germany

[73] Assignee: Siemens Aktiengesellschaft, Berlin and Munich, Fed. Rep. of Germany

[21] Appl. No.: 860,170

[22] Filed: May 6, 1986

[30] Foreign Application Priority Data

May 13, 1985 [DE] Fed. Rep. of Germany ....... 3517254

[51] Int. Cl.$^4$ .................. H03H 9/145; H03H 9/64; H03H 9/42
[52] U.S. Cl. ............................. 333/194; 310/313 D; 333/154; 333/195
[58] Field of Search .................. 333/150-155, 333/193-196; 310/313 A, 313 B, 313 C, 313 D, 313 R; 29/25.35

[56] References Cited

U.S. PATENT DOCUMENTS 3,573,673 4/1971 De Vries et al. .................. 333/194
3,872,410 3/1975 Zucker ............................ 333/194
4,516,094 5/1985 Lee .................................. 333/194

FOREIGN PATENT DOCUMENTS 2235233 7/1977 Fed. Rep. of Germany .
1441602 7/1976 United Kingdom ............... 333/194
2050742 5/1980 United Kingdom .

OTHER PUBLICATIONS

Cross et al., "Very Low Loss SAW Resonators Using Parallel Coupled Cavities", 1982, IEEE, pp. 284-289.
Desbois, "The Problem of the Accuracy in the Fabrication of Multipole SAW Resonator Filters", 1979, IEEE, pp. 841-844.
Coldren, "Surface-Acoustic-Wave Resonator Filters", Jan. 1979, IEEE, pp. 147-158.
U.S. Ser. No. 819,304, (VPA 85 P 1026), Bulst et al., assigned to Siemens AG.

Primary Examiner—Marvin L. Nussbaum
Attorney, Agent, or Firm—John Francis Moran

[57] ABSTRACT

A surface wave filter (1, 11, 21, 31, 41) having a shielding structure (13, 23, 33, 43, 53) arranged between the inter-digital, asymmetrically operating structures (2, 3), which encompasses two such sub-structures (14, 24, 34, 44, 44a) and/or (15, 25, 35, 45, 35a), which are individually connected with the finger structures of the adjacent transducer structure (2 and/or 3) that are at reference ground potential.

6 Claims, 5 Drawing Figures

ELECTRIC FILTER EMPLOYING ACOUSTIC WAVES

BACKGROUND OF THE INVENTION

This invention relates to an electrical filter, and more particularly, it relates to a surface acoustic wave (SAW) filter wherein an intermediate structure between input and output transducers reduces cross-coupling and/or interference.

An acoustic wave filter, used as a resonant filter, which employs input and output transducers arranged directly adjacent to each other on the surface of the substrate has been described in the Proceedings of IEEE, Volume 67 (1969), Page 147-157, FIG. 3. Even with this described polarization arrangement, however, a disturbing degree of cross-coupling between input and output is present. Naturally, such cross-coupling reduces the effective operational characteristics of the SAW filter by providing an unwanted shunt signal path.

In order to provide shielding between the input and output transducers, various arrangements have therefore been provided, as are described in "1982 Ultrasonics" Symposium 1982 IEEE, Pages 284-289, FIG. 6. Basically therefore, such a shielding arrangement makes use of a ridge-like structure, oriented transverse to the principal propagation axis of the waves travelling in the filter which is provided as a surface coating for the substrate and that also serves as a ground potential reference. This surface coating, which is at ground potential, forms a broad stripe positioned between the input and output transducers and has good shielding properties. At relatively high frequencies, however, the effect of the inductances of the leads on this shielding becomes significant as a disadvantage and stray potentials develop on the coated shielding which cause interference between input and output terminals of this filter.

Additional reference is also made to Ultrasonics Symposium 1979 IEEE, Pages 841-844.

SUMMARY OF THE INVENTION

An object of the present invention is to achieve further improvements with respect to the reduction of cross-coupling and/or reduced interference between the input and output of a filter employing acoustic waves.

The present invention is based upon the concept that a further improvement may be achieved if, in accordance with the fundamental principles of the invention, the previously deployed strip oriented transverse to the principal propagation axis of the waves is divided into at least two sub-structures and/or electrically separated. This arrangement makes it possible to connect one of these sub-structures electrically to the collecting bus of the adjacent transducer structure which is at reference potential, and to connect the other sub-structure electrically to the collecting bus of the other transducer structure which is at reference potential, and which transducer structure is adjacent to this other sub-structure, without interfering effects becoming evident, and whereby one of these transducer elements is the filter input and the other the filter output.

An important aspect of this inventive concept is that no stray potential due to previously unavoidable inductances are allowed to develop over the shielding structure. Such a potential has been produced by the current flow between the sampling track of one of the transducers lying at reference potential and the sampling track of the other transducer lying at reference potential. This current flow is reliably prevented through the transverse electrical interruption provided, in accordance with the invention, without producing any reduction in the shielding properties.

In particular, the invention provides that the sub-structures are comprised of strip formed coatings, connected to each other electrically, which are identical to the strip formed coatings of the digital structure of the filters. Preferably the sub-structures, consisting of a number of these strip formed coatings, will have at least one collector lead, preferably one at each end, from which this, and/or one of the collector leads, is connected via a conducting coating to the aforementioned collecting bus of the adjacent transducer structure lying at reference potential.

One application of the invention to a filter which has a coupling structure between the input transducer and the output transducer such as is shown in FIG. 7, in Proc. of the IEE, Volume 67 (1979), Page 150, is of particular advantage. Another particularly advantageous application of the invention is offered, in an acoustic wave operating filter in accordance with the earlier unpublished German patent application No. P 35 01 977.8, in which an arrangement is shown in the included Figure, of an additional structure between the input transducer and the output transducer. The corresponding patent application was also filed in the United States on Jan. 1, 1986 and assigned Ser. No. 819,304. This is an assembly of strip-formed electrically conducting coatings, corresponding to the strip-formed coatings of the digital structures of the filter and which are so positioned and formed, that they are non-reflecting. They are provided in the filter, in accordance with the application, in order to equalize the illumination during the photo-lithographic fabrication of the filter.

BRIEF DESCRIPTION OF THE DRAWING

Features of the invention and additional objects of the invention will be more readily appreciated and better understood by reference to the following detailed description which should be considered in conjunction with the drawing.

DETAILED DESCRIPTION

Figure 1:
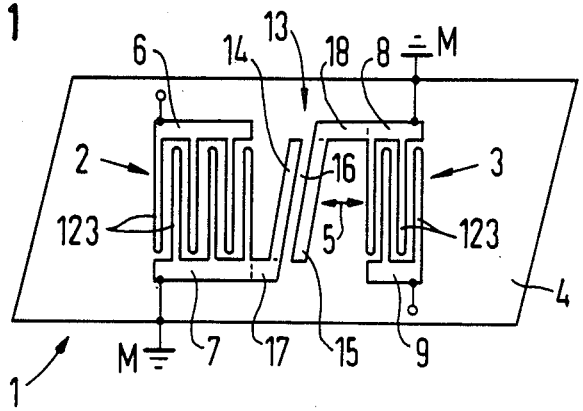
FIG. 1 depicts a first illustrative embodiment of the invention including a basic shielding structure.

FIG. 1 shows a filter 1, in accordance with the invention with two interdigital structures 2 and 3, of which one is an input transducer and the other is an output transducer. These interdigital structures 2, 3 are typically constructed in the conventional manner and may have various special forms. A basic characteristic of these transducers is that they possess electrode fingers made of the electrically conducting (metal) coatings on the surface of the piezoelectric substrate 4. These interdigitally arranged strip-formed coatings of the finger electrodes are connected and oriented to provide a principal directional propagation axis 5 for the wave medium in this filter. In other words, a successive series of waves is generated in response to the potential applied or produced at collecting bus 6 and/or 7, respectively with a collecting bus 8 and/or 9, of one of the transducer structures 2 and/or the other transducer structure 3. For the asymmetrical operation, for which the filter may be employed, the collecting buses, 7 and 8, for example, are at a common reference potential, particularly at ground potential. The other collecting buses, 6 and 9 serve as the floating or hot connecting terminals of the filter 1. Reference numeral 13 generally designates ridge-formed structure (not shown for the sake of simplicity) of a surface coating of the substrate 4, arranged to be essentially transverse to the principal propagation axis 5. The partial structures 14 and 15 of these are separated electrically from each other by a spacing or free strip 16, that is also oriented to be transverse to this axis 5 but which exhibits no electrically conducting coating of the substrate 4. However, this strip 16 is preferably made relatively narrow, in particular to conserve space. The slanting of the sub-structures 14 and 15 indicated in FIG. 1 serves, for example, to reflect diagonally outward, the reflected parts of the wave edges travelling transverse to the axis 5.

As may be seen in FIG. 1, connecting coating structures 17, 18 are provided, which electrically connect the collecting bus 7 with the sub-structure 14, and the collecting bus 8 with the sub-structure 15. By this means the sub-structures are at reference potential, that is, these sub-structures 14 and 15 can reliably serve as shielding in the manner of the known ridge-formed surface coating. However, no electric current can flow oer these sub-structures 14 and 15 which would, particularly at high frequencies, lead to interfering potentials due to unavoidable serial inductive reactance. The shielding system includes the elements 7, 8, 17, 18, 14 and 15. In this embodiment, according to the invention, the sub-strucure 14 is connected via the conducting coating 17 to the collecting bus 7 of the transducer structure 2, lying at ground reference potential, which is, for example, the input transducer of the filter 1.

Figure 2:
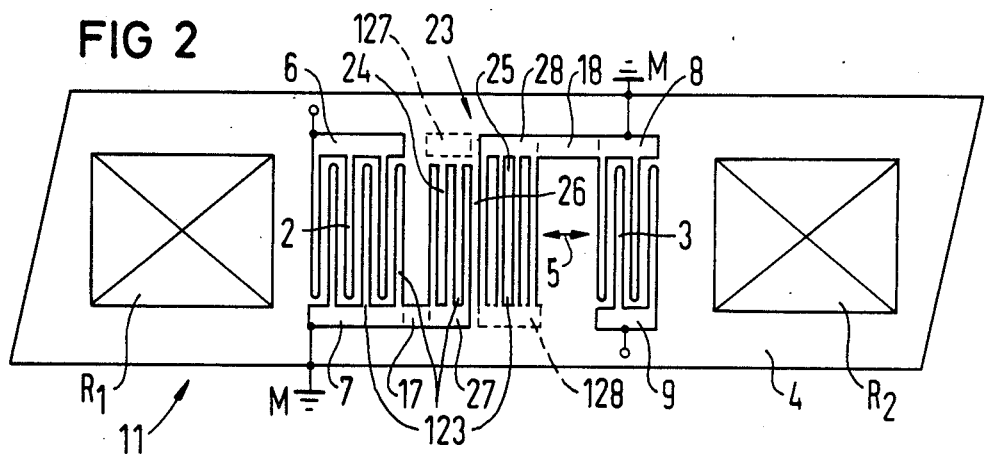
FIG. 2 is a second illustrative embodiment of the invention in which there is an additionally provided coupling structure which, moreover, is designed to provide shielding according to the principles of the invention.

FIG. 2 illustrates another embodiment of the invention, wherein the similar elements in FIG. 2 which have the same reference numerals as those described in FIG. 1. The basic primary difference between the filter 11, in FIG. 2 and that of FIG. 1 is the application of a coupling structure 23, comprised of a many strip-formed surface coating which include a number of strip formed surface coatings 123 arranged in succession in the direction of the axis 5. One of the embodiments based upon the arrangement of FIG. 2, with a coupling structure between two interdigital transducers 2, 3 is known, for example, from the above-mentioned literature—Ultrasonic Symposium (1979), Page 841, FIG. 1 Proceedings of the IEEE, Volume 67 (1978), Page 150, bottom line, in FIG. 7. In such a coupling structure, the strip formed coating 123 corresponding, as a general rule, in its construction and in its size, to the finger electrodes of the transducers 2, 3; there is however no inter-digital arrangement provided for a coupling structure having the necessary required collecting buses. Such a coupling structure leads in fact to gradual decoupling.

Such a coupling structure, shown in accordance with the invention, in the embodiment of FIG. 2, is concurrently employed as a shielding structure (corresponding to the structure 14, 15 of FIG. 1) and is correspondingly specially formed. This coupling structure 23 is, according to the invention, divided into (at least) two sub-structures 24 and 25 which are separated from each other by a free strip 26. This is no wider, for example, than the separation of the strip-formed coatings 123 within the individual coupling structures 24, 25 of the transducers 2, 3. However, a wider free strip 26 may also be provided, if a strip-formed coating (such as 123), of the noted coupling structure is omitted.

In a special type of construction, the sub-structure 24 has at least one collecting bus 27. The same applies to the sub-structure 25 with its collecting bus 28. As seen in FIG. 2, the collecting buses 27 and/or 28 serve to electrically interconnect the strip-formed coatings 123 of one of the sub-structures 24 and/or the other sub structures 25. In accordance with the invention, connecting coatings 17 and 18 are provided, as shown in the embodiment of FIG. 2, which connect these sub-structures 24 and 25 respectively with the collecting buses 7 and/or 8 of the transducer structures 2 and/or 3, which are at reference potential.

As in the arrangement of FIG. 2, it is impossible for electric current flow and the appearance of a corresponding disturbing potential between the transducers 2 and 3, to lead to interference.

As may be observed from FIG. 2, additional collecting buses or, in their generalized form, their corresponding surface coatings 127 and 128 may be provided. The surface coating 127 may also be connected to the strip-formed coating 123 of the sub-structure 24. There is, however, no compelling need for this connection. This also applies to the additional surface coating 128, and this second alternative possibility is shown, with electrical connections, in the case of sub-structure 25. In particular, these additional surface coatings 127 and 128, corresponding to the collecting buses, serve in achieving presence and symmetry in the location and arrangement of surface coatings.

This coupling structure, comprised of the sub-structures 24 and 25 together with the existing structure 23 and the strip-formed coating 123, has reflective properties. This reflective action refers to the acoustic waves produced in, and/or travelling in, the filter in the direction of the principal propagation axis 5. In addition, the embodiment of FIG. 5 contains (as in the above noted technology) reflector structures R1 and R2. Because of the reflective action of the coupling structure 23, both elements (in FIG. 2) lying to the left and right on the structure 23 of the filter 21 in FIG. 2 are acoustically and, due to the piezoelectric properties of the substrate, electrically, coupled to each other.

A filter according to the invention may also be designed, with the corresponding sub-structures 24 and 25, used as shielding elements between the transducer structures 2 and 3, without these sub-structures 24 and 25 operating together as a coupling structure and/or being required to so operate. The application of supplemental structures consisting of strip-formed surface coatings is described in the above noted earlier German patent application P 35 01 977.8. In the design noted in this earlier patent application, such a structure, designated 100, is shown located between the two transducer structures of the filter.

The idea of this supplemental structure is to achieve an equalization, for and/or in the course of, the photolithographic fabrication of the strip-formed coatings of this structure. For this reason, the strip-formed coatings of such a supplemental structure are designed to correspond to the strip-formed surface coatings of the necessary digital structures transducer structures and reflector structures) of the filter in this earlier patent application. This earlier application also describes the alternative; a supplemental structure provided with collecting buses, there identified with 106. It is decisive in this filter, according to the earlier application, that the supplemental structure arranged between the two interdigital transducers is designed and/or dimensioned to be reflection-free for the acoustic wave. This is contrary to the coupling structure 23 of FIG. 2 of the present invention. The manner in which such a (supplemental) structure may be designed to be reflection free, if not already known, is described in detail in the earlier referenced application. This is to be achieved, in particular, (as in the necessary structures of the filter) through slanted dimensioning of the separation of the strip-formed coatings, or through the use of separating gaps of a size equal in width to a quarter of the effective wavelength of the acoustic wave (as in the structure designated 200 in the earlier application).

Figure 3:
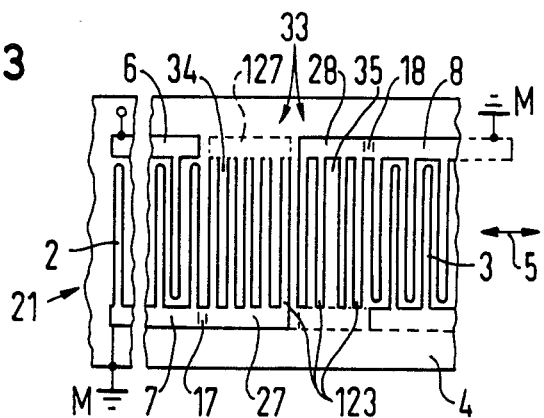
FIGS. 3 through 5 illustrate sectional views of further embodiments, the additional parts of which, correspond to FIG. 2, for example, and in which the shielding structure designed in accordance with the invention, concurrently serves the function in accordance with the patent application No. P 35 01 977.8 and/or is an energy trapping grating structure.

In FIG. 3, of the presently described invention, this further illustrative embodiment 21 is shown in a partial section only. The structure 33 is a totally reflection free structure and is comprised of the sub-structures 34 and 35. The strip-formed coatings 123 of the structures 34 and 35, however, have spacings selected to correspond to the earlier referenced application. The sub-structure 34 has (middle-) spacings, separating the individual strip-formed coatings 123 from each other, that deviate by a measured amount from the (middle-) spacings of the strip-formed spacings of the necessary digital structures of the filter, that is, deviating from those (middle-) spacings which determine the mid-frequency and/or the effective wave length of the filter under consideration. The size of this deviation is so selected, that the frequency of the first null location of the inter-digital reflections of the strip-formed coatings of the sub-structure 34, coincides with the pre-established mid-frequency of the filter.

The sub-structure 35 may be produced in the same way as the sub-structure 34. The presentation of FIG. 3, however, shows a second alternative of a reflection free structure in the filter, that is, with an arrangement of the strip-formed coatings in which the individual strip-formed coatings 123 of the sub-structure 35 are arranged, preferably as groups, so that the (middle-) spacings of individual strip-formed coatings 123 and/or the strip-formed coatings of individual groups differ by one (and/or by an uneven integer of one) quarter wavelength from the spacings of the strip-formed coatings of the structures 2 and/or 3, which determine the frequency of the filter.

In the light of the earlier application, the spacing between the structure 2 and the sub-structure 34, and/or the spacing between structure 3 and the sub-structure 35, is preferably reduced to the spacing of the strip-formed coatings 123 of the finger electrodes of the transducers 2, 3, in order that the connecting coatings 17, 18 be correspondingly short.

Further elements of a filter according to FIG. 3 correspond to those of a filter according to FIG. 2. The same correspondence applies to the reference numbers.

Figure 4:
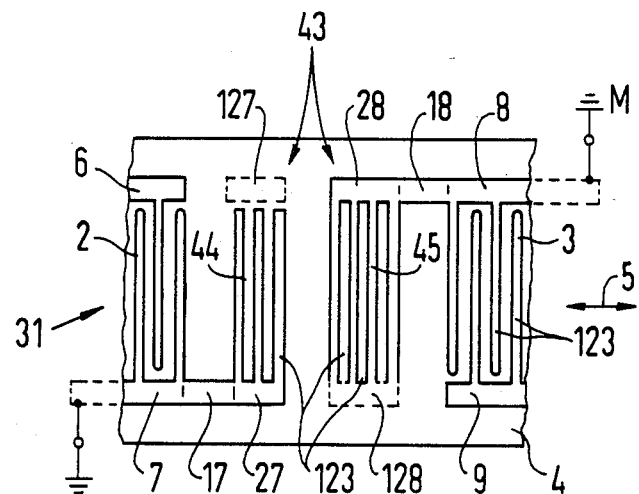

An arrangement is noted in "1979 Symposium" Pages 783 to 785 for SBAW and for SSBW acoustic waves which are special kinds of acoustic waves, travelling near the surface of the substrate, and which, in the sense of the present invention, fall under the category of surface waves as here defined, in which a supplemental "energy trapping grating" structure is employed between the input transducer structure and the output transducer structure, which are spaced apart on the surface of the substrate. FIG. 4 shows a sectional view of such an arrangement 31. This energy trapping grating structure, provided between the transducer structures, serves to prevent the SBAW wave travelling between the two transducer structures from leaving the surface region of the substrate, that is, to submerge into the interior of the substrate body. For such a structure it is sufficient to provide strip-formed coatings which, in view of the resonance established by their structure, have however, entirely different special dimensions compared to the transducer patterns. The resonance frequency of this structure, used to prevent the SBAW-waves from submerging lies at about 1.25 times the mid-frequency of the transducer structures and/or the entire filter, that is, in comparison, the individual strip-formed coatings have considerably narrower periodic spacings between each other. Therein such an energy trapping grating structure differs, for example, from the above noted filling structure described in detail in the earlier application with the special selection of its frequency, corresponding to the first null point of the interdigital reflection of the filter. Mention is made in the literature that the structure provided for the SBAW and/or SSBW is at ground and is effective in shielding.

An energy trapping grating structure 43, such as previously described, is developed in accordance with the invention, with the additional elements shown in FIG. 4, in such manner that (at least) two sub-structures 44, 45 are formed, as before in the corresponding designs, particularly of FIGS. 2 and 3, and are individually connected to the adjacent transducer structures 2, 3, so that the shielding is separated.

The embodiments of the invention described in FIGS. 2 through 4 in particular, relate to cases having either one coupling structure (FIG. 2), one full structure (FIG. 3) or one energy trapping grating structure for SSBW waves (FIG. 4). It is possible, especially in the case of the coupling structure derived from the filter design in accordance with the above, that this coupling structure will have very few, e.g. two or four strip-formed coatings. The above noted division into two sub-structures 24 and 25 would then indicate that a respective sub-structure 24, 25 consists of only two, or even only one, strip-formed coating. The latter would, as far as the number of strips are concerned, would correspond generally to the arrangement of FIG. 1. In the filter of FIG. 1 however, the sub-structure 14, 15 are coatings, the strip width of which is large compared to the strip-formed coating 123; in other words the width of which is about a quarter wavelength. A narrow strip-formed coating such as 123 may have such a low electrical conductivity along this strip-formed coating that it possesses too high a resistance to provide the required shielding action along this strip.

Figure 5:
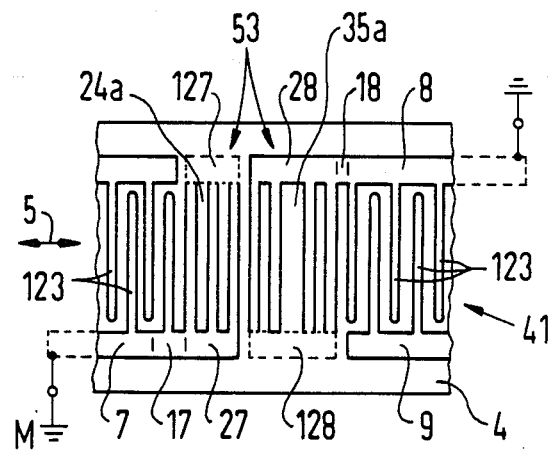

For the case previously described, there is a further arrangement 41 in FIG. 5, which may be used, that is to leave undivided, a coupling structure 24a encompassing only a few, for example, a maximum of four strip-like coatings 123, that is to employ one, of the (at least) two, sub-structures of the inventive concept. The application of another structure e.g. a filling structure 35a as in FIG. 3 or an energy trapping grating structure as in FIG. 4, then suggests itself as the second sub-structure. Such an embodiment is thus the equivalent of a mixture corresponding, in principle, to FIG. 2 (with only a few coupling strips) on the one hand, and to FIGS. 3 or 4 on the other.

The two sub-structures 24a, 35a, corresponding to the respective different principles described here, are operated according to the invention, so that, on the one hand, the sub-structure (that is the total coupling structure exhibiting only these few coupling strips) with which one transducer structure, 2, is connected, and placed at the reference potential and, on the other hand, that another structure (filling structure and/or energy trapping grating structure) is provided as an associated second sub-structure 35a and is connected electrically with the other transducer structure 3 and tied to the reference potential. According to the invention there is then again a shielding structure 53 and two sub-structures 24a, 35a which working together and in common enable the attainment of the necessary shielding effect, even though these two sub-structures of themselves, have separate and different functions in the filter.

There has thus been shown and described a novel SAW filter which fulfills all the objects and advantages sought therefor. Many changes, modifications, variations and other uses and applications of the subject invention will, however, become apparent to those skilled in the art after considering this specification which discloses preferred embodiments thereof. All such changes, modifications, variations and other uses and applications which do not depart from the spirit and scope of the invention are deemed to be covered by the invention which is limited only by the claims which follow.

We claim:

1. An surface acoustic wave (SAW) device of the type formed by a piezoelectric substrate having a substrate surface and at least two transducers disposed on said surface, said device comprising a first transducer of said two transducers serving as an input means for receiving an electrical input signal and producing acoustic wave energy, said first transducer including a first collecting bus connected to ground potential, a second transducer of said two transducers serving as an output means for receiving acoustic wave energy and producing a electrical output signal, said second transducer including a second collecting bus connected to ground potential, first shielding means having a first interconnection bus and a first plurality of digital strips extending from the first interconnection bus to occupy a first region on the substrate surface serving as a medium for the acoustic wave energy of said first transducer, the first interconnection bus extending toward the first collecting bus to be electrically connected therewith, second shielding means having a second interconnection bus and a second plurality of digital strips extending from the second interconnection bus to occupy a second region on the surface of the substrate serving as a medium for the acoustic wave energy being received by said second transducer, the second interconnection bus extending toward the second collecting bus to be electrically connected therewith, and said first and second plurality of digital strips being separated from each other by a predetermined free space therebetween.

2. A SAW device in accordance with claim 1, wherein the first interconnection bus of the first shielding means and the first collecting bus of the first transducer form a first integral bus and the second interconnection bus of the second shielding means and the second collecting bus of the second transducer form a second integral bus and the first and second shielding means together serve as a coupling structure between said first and second transducers.

3. A SAW device in accordance with claim 1, wherein the respective pluralities of digital strips of the first and second shielding structures substantially occupy a region between said first and second transducers which also comprises the first and second regions.

4. A SAW device in accordance with claim 3, wherein the respective pluralities of digital strips of the first and second shielding structures have a common orientation which is transverse to the direction of acoustic wave energy.

5. A SAW device in accordance with claim 1, wherein the respective pluralities of digital strips of the first and second shielding structures are parallel and each digital strip has an orientation which is normal to the direction of propagation of acoustical energy between the first and second transducers.

6. A SAW device in accordance with claim 1, wherein the first and second shielding structures include a predetermined space between it and its respective transducer to form an energy trapping grating structure.

* * * * *